US012782429B2

(12) United States Patent
Rumiantsev et al.

(10) Patent No.: US 12,782,429 B2
(45) Date of Patent: Nov. 3, 2026

(54) METHOD OF DETERMINING PROBING PARAMETERS FOR PROBE SYSTEM TO TEST DEVICE UNDER TEST

(71) Applicant: MPI CORPORATION, Chu-Pei City (TW)

(72) Inventors: Andrej Rumiantsev, Chu-Pei City (TW); Lin-Lin Chih, Chu-Pei City (TW); Ching-Ling Pai, Chu-Pei City (TW)

(73) Assignee: MPI CORPORATION, Chu-Pei City (TW)

( * ) Notice: Subject to any disclaimer, the term of this patent is extended or adjusted under 35 U.S.C. 154(b) by 157 days.

(21) Appl. No.: 18/781,351

(22) Filed: Jul. 23, 2024

(65) Prior Publication Data

US 2025/0044350 A1 Feb. 6, 2025

Related U.S. Application Data

(60) Provisional application No. 63/530,768, filed on Aug. 4, 2023.

(51) Int. Cl.
*G01R 31/28* (2006.01)
*G01R 1/067* (2006.01)
(Continued)

(52) U.S. Cl.
CPC ..... *G01R 31/2886* (2013.01); *G01R 1/06738* (2013.01); *G01R 1/073* (2013.01);
(Continued)

(58) Field of Classification Search
CPC ........... G01R 31/2886; G01R 1/06738; G01R 1/073; G01R 31/2874; G01R 31/2891
See application file for complete search history.

(56) References Cited

U.S. PATENT DOCUMENTS 7,256,596 B1 8/2007 Russell
11,119,122 B2 * 9/2021 Furuya ............... G01R 31/2891
(Continued)

FOREIGN PATENT DOCUMENTS

JP 5-166892 A 7/1993
JP 6-11539 A 1/1994
(Continued)

*Primary Examiner* — Giovanni Astacio-Oquendo
(74) *Attorney, Agent, or Firm* — Birch, Stewart, Kolasch & Birch, LLP

(57) ABSTRACT

A method of determining probing parameters for a probe system to test a DUT includes defining a SD-OD relation dataset according to the probe type of the probing assembly of the probe system and the contact pad type of the DUT, and providing the controller a skate distance value, for which the probe tip is set to skate after contacting the contact pad, or an overdrive value, for which the probing assembly and the DUT are set to be relatively moved after the probe tip contacts the contact pad, and a probe target position or a present probe position, to obtain both the skate distance value and the overdrive value and a position for positioning the probing assembly and the DUT to each other, thereby conveniently and quickly obtaining the required probing parameters for operating the probe system to test the DUT for great and consistent testing performance.

18 Claims, 12 Drawing Sheets

(51) Int. Cl.
*G01R 1/073* (2006.01)
*G01R 35/00* (2006.01)
*H10W 46/00* (2026.01)

(52) U.S. Cl.
CPC ..... *G01R 31/2874* (2013.01); *G01R 31/2891* (2013.01); *G01R 35/005* (2013.01); *G01R 35/007* (2013.01); *H10W 46/00* (2026.01); *H10W 46/301* (2026.01)

(56) References Cited

U.S. PATENT DOCUMENTS

| | | | | |
|---|---|---|---|---|
| 12,203,959 | B2 * | 1/2025 | Schindler | G01R 31/2891 |
| 2007/0159192 | A1 | 7/2007 | Hasegawa et al. | |
| 2017/0296056 | A1 * | 10/2017 | Hresko | G16H 40/40 |
| 2020/0001048 | A1 * | 1/2020 | Oren | G06T 7/70 |
| 2020/0124669 | A1 | 4/2020 | Sakamaki | |
| 2020/0338351 | A1 * | 10/2020 | Panken | A61N 1/36139 |
| 2021/0318354 | A1 * | 10/2021 | Hetsugi | G01R 1/06794 |

FOREIGN PATENT DOCUMENTS

| | | | |
|---|---|---|---|
| JP | 8-321529 | A | 12/1996 |
| JP | 2000-35443 | A | 2/2000 |
| JP | 2007-183193 | A | 7/2007 |
| JP | 2007-183194 | A | 7/2007 |
| JP | 2007-248412 | A | 9/2007 |
| JP | 2009-512230 | A | 3/2009 |
| JP | 2023-520095 | A | 5/2023 |
| TW | 200700735 | A | 1/2007 |

* cited by examiner

METHOD OF DETERMINING PROBING PARAMETERS FOR PROBE SYSTEM TO TEST DEVICE UNDER TEST

CROSS REFERENCE TO RELATED APPLICATIONS

This non-provisional application claims the benefit under 35 U.S.C. § 119 (e) to U.S. Provisional Application No. 63/530,768, filed on Aug. 4, 2023, all of which is hereby expressly incorporated by reference into the present application.

BACKGROUND OF THE INVENTION

1. Field of the Invention

The present invention relates generally to test technology with a probing assembly and more particularly, to a method of determining probing parameters for a probe system to test a device under test, and a method of operating a probe system, a probe system, a non-transitory computer-readable storage media, a method of testing an unpackaged semiconductor device, a method of producing a tested semiconductor device, and a tested semiconductor device, which use the aforementioned method of determining the probing parameters, and a method of generating a virtual mark image.

2. Description of the Related Art

Referring to FIG. 1A and FIG. 1B, it is well known that when a probing assembly is utilized to test a device, the device under test (also referred to as "DUT" hereinafter) is disposed on a chuck. The probing assembly and the chuck are firstly relatively moved to the status that a probe tip 11 of a probe 10 of the probing assembly is in initial contact with a contact pad 12 of the DUT. At this time, the probe tip 11 of the probe 10 is located at an initial contact position P1, as shown in FIG. 1A and FIG. 1B. Then the probing assembly and the chuck are relatively moved along a vertical axis (i.e. Z-axis) for a distance referred to as overdrive OD, which is usually performed in a way that the chuck is moved from the contact height upwardly to approach the probing assembly, making the probe tip 11 of the probe 10 and the surface of the contact pad 12 of the DUT forced to abutted against each other positively. Meanwhile, the probe tip 11 of the probe 10 is deflected, which means it is moved on X-axis or Y-axis, thereby skating on the surface of the contact pad 12 for another distance referred to as skate distance SD and then stopped at a final contact position P2, producing a probe scratch, which is also called "probe mark", on the surface of the contact pad 12. The length of the probe scratch equals to the skate distance SD. To enable the probing assembly to provide great testing performance to the DUT and keep consistent testing performance, it is usually desired to produce the identical probe scratch in every time of testing, which means it is desired to have accurate initial contact position P1, final contact position P2 and the skate distance SD.

Currently, before test begins, using a calibration substrate to determine the correct overdrive OD is necessary. However, this process is inconvenient and time-consuming. For example, in practical operation, the calibration substrate and the DUT have at least the difference in material. Therefore, even if the proper overdrive OD is obtained at the calibration substrate, it is still difficult to make sure that this overdrive OD, when being applied to the DUT, can make the probe tip 11 of the probe 10 stopped at the desired final contact position P2. When a calibration standard (testing circuit) on the calibration substrate serves as the DUT, multiple calibration measurements of overdrive OD are often required to determine which initial contact position P1 ensures the probe tip 11 stops at the desired final contact position P2. This process is not only inconvenient and time-consuming, but also causes wear and tear to the probe or the calibration standard due to repeated operation. Additionally, errors in the calibration of overdrive OD may result in inaccurate final contact positions P2 during practical testing, leading to incorrect test results. Especially, in high frequency testing, the accurate final contact position P2 is even more important. Further specifically speaking, once the overdrive OD is determined, this setting will be applied to all DUTs on a substrate. Therefore, individual adjustment of overdrive OD for each DUT to ensure the probe tip 11 stops at the desired final contact position P2 are impractical for achieving consistent and optimal testing results.

In addition, during the test, the use of an image-forming device, such as a microscope, is required for observing whether the probe tip 11 of the probe 10 initially contacts the contact pad 12 of the DUT at the desired initial contact position P1. However, the field of view (also referred to as "FOV") of the image-forming device is very small. Therefore, the probe tip 11 of the probe 10 and the contact pad 12 of the DUT usually cannot be clearly recognized at the same time, unless the probe tip 11 of the probe 10 and the contact pad 12 of the DUT are on the same plane. But when on the same plane, the probe tip 11 of the probe 10 and the contact pad 12 of the DUT are already in contact with each other. It can be seen that even if the desired initial contact position P1 is known, it is still difficult to position the probe tip 11 of the probe 10 at the desired initial contact position P1 accurately. Therefore, it is difficult to produce consistent probe scratch, so that it is difficult to keep the testing performance of the probing assembly on the DUT great and consistent.

SUMMARY OF THE INVENTION

The present invention has been accomplished in view of the above-noted circumstances. It is an objective of the present invention to provide a method of determining probing parameters for a probe system to test a DUT, which can obtain the required probing parameters conveniently and quickly to enable the probing assembly to provide great and consistent testing performance.

To attain the above objective, the present invention provides a method of determining probing parameters for a probe system to test a DUT, which includes the steps of:

- defining a skate distance to overdrive relation dataset (also referred to as "SD-OD relation dataset" hereinafter) according to the type of a probe of a probing assembly of the probe system and the type of a contact pad of the DUT;
- providing one of a skate distance value and an overdrive value to a controller, the skate distance value being the distance, for which a probe tip of the probe is set to skate on the contact pad of the DUT after contacting the contact pad, the overdrive value being the distance, for which the probing assembly and the DUT are set to be relatively moved after the probe tip of the probe contacts the contact pad of the DUT;
- providing one of a probe target position and a present probe position to the controller, the probe target position being the position, at which the probe tip of the probe is predetermined to be stopped after skating on the contact pad of the DUT, the present probe position being the present position of the probe tip of the probe; and obtaining, with the controller and based on the aforementioned one of the skate distance value and the overdrive value and the SD-OD relation dataset, the other of the skate distance value and the overdrive value, and obtaining, based on the skate distance value and the aforementioned one of the probe target position and the present probe position, a position for positioning the probing assembly and the DUT to each other.

As a result, the SD-OD relation dataset can be stored in the controller beforehand. Alternatively, the relation between the skate distance and the overdrive can be measured with a calibration substrate before the test begins, and this relation dataset is then established in the controller. Afterward, providing predetermined skate distance value or overdrive value and the predetermined probe target position or the present probe position, the controller can use this relation dataset to calculate both the skate distance value and the overdrive value. Additionally, depending on the requirements of different alignment manners, the corresponding parameter can be calculated. For example, using the probe target position and the skate distance value to determine the position at which the probe tip should start contacting the contact pad of the DUT, such as the initial contact position P1 shown in FIG. 1B. In other words, once the SD-OD relation dataset has been established, the required parameters for testing the DUT with the probing assembly can be obtained as long as the user inputs certain parameters, such as the skate distance value and the probe target position, into the controller. It is unnecessary to perform, before every time of testing, the time-consuming initial setting steps, such as using the calibration substrate to find out the proper overdrive, performing many times of calibration measurement for the overdrive to obtain the initial contact position, and so on. Moreover, the method of the present invention ensures accurate parameters to stop the probe tip at the desired probe target position after skating on the contact pad of the DUT. Therefore, the present invention provides the method for determining the probing parameters in a probe system to test the DUT. This method not only saves time and offers convenience, but also enhances the testing accuracy by enabling the probing assembly to deliver consistent and excellent performance, thereby reducing wear on the probe and calibration substrate and extending their lifespan.

Preferably, as the example given in the previous paragraph, the probe target position is provided to the controller. The aforementioned position for positioning the probing assembly and the DUT to each other is a probe contact position. The probe contact position is the position, at which the probe tip of the probe is predetermined to start contacting the contact pad of the DUT, for the probe tip of the probe to be positioned at the probe contact position.

As a result, once the controller has determined the probe contact position, the probe tip of the probe can be directly positioned there before initiating the overdrive ON process, ensuring it reaches the desired probe target position.

More preferably, the method of determining the probing parameters for the probe system to test the DUT further includes the step of affirming that both the probe contact position and the probe target position are within an acceptable scope corresponding in position to the contact pad of the DUT.

As described above, the controller can perform the calculation through the SD-OD relation dataset to make the skate distance value, the overdrive value, the probe contact position and the probe target position all known. Therefore, after both the probe contact position and the probe target position are known, it can be further affirmed whether the two positions both fall within the acceptable scope corresponding in position to the contact pad of the DUT. This ensures that the probe tip of the probe will make positive contact with the contact pad of the DUT throughout the entire overdrive process, producing a proper probe scratch and thereby ensuring the testing accuracy even more.

More preferably, the method of determining the probing parameters for the probe system to test the DUT further includes the step of generating, with the controller, a virtual alignment mark showing the probe contact position for the probe tip of the probe to be aligned with the virtual alignment mark.

As a result, when the user performs the manual alignment, even though the microscope can only clearly show the probe tip of the probe but the contact pad of the DUT is blurred and unclear, as long as the virtual alignment mark is shown on the screen, the user can position the probe tip of the probe at the probe contact position accurately by aligning the probe tip of the probe with the virtual alignment mark. After that, when an overdrive ON process is performed, the probe tip of the probe can be ensured to be stopped at the desired probe target position. Besides, in the automatically positioning condition, the virtual alignment mark can be also shown on the screen for the user to know the present situation.

Preferably, instead of providing the probe target position to the controller, the present probe position is provided to the controller. Accordingly, the aforementioned position for positioning the probing assembly and the DUT to each other is a relative target position, wherein the relative distance between the relative target position and the present probe position equals to the skate distance value, for positioning the probing assembly and the DUT to each other by making the relative target position and the probing assembly moved relative to the DUT simultaneously and making the relative target position relatively moved to a position corresponding to the contact pad of the DUT.

As a result, the aforementioned position corresponding to the contact pad of the DUT can be visually set by the user without providing numeral value thereof to the controller. More specifically speaking, the aforementioned position corresponding to the contact pad of the DUT can be the position, at which the user predetermines the probe tip to be stopped after skating on the contact pad of the DUT, similar to the aforementioned probe target position but not set with numeral value and visually decided by the user during the operation. Based on the skate distance value and the present probe position, the relative target position can be obtained by calculation for the user to relatively move the relative target position to the probe stopped position decided by the user. Alternatively, even if the probe target position is known, the positioning can be performed without using the probe contact position, but using the relative target position obtained by calculation to relatively move the relative target position to the probe target position. In such condition, the aforementioned position corresponding to the contact pad of the DUT is the probe target position. The relative target position is moved along with the probing assembly relative to the DUT. As long as the relative target position is relatively moved to the aforementioned position corresponding to the contact pad of the DUT, the probe tip of the probe is located at a proper position on the contact pad of the DUT so that after an overdrive ON process is performed, the probe tip of the probe will be stopped at the desired position.

More preferably, the method of determining the probing parameters for the probe system to test the DUT further includes the step of generating, with the controller, a virtual alignment mark showing the relative target position, for the virtual alignment mark to be relatively moved to the aforementioned position corresponding to the contact pad of the DUT, so as to make the relative target position relatively moved to the aforementioned position corresponding to the contact pad of the DUT.

As a result, when the user performs the manual alignment, even though the microscope cannot clearly show the contact pad of the DUT and the probe tip of the probe at the same time, as long as the virtual alignment mark is shown on the screen and the virtual alignment mark and the probing assembly are simultaneously moved relative to the DUT, the user can align the virtual alignment mark with the probe target position in the condition that the probe target position is also shown on the screen. Alternatively, in the condition that the contact pad of the DUT is clearly shown on the screen, the user can relatively move the virtual alignment mark to the visually set probe stopped position. In this way, the probe tip of the probe is located at a proper position on the contact pad of the DUT so that after an overdrive ON process is performed, the probe tip of the probe will be stopped at the desired position. Besides, in the automatically positioning condition, the virtual alignment mark can be also shown on the screen for the user to know the present situation.

Preferably, the SD-OD relation dataset is established with the probe system and a calibration substrate by a process including the steps of:

- making the probe tip of the probe in contact with the calibration substrate;
- making the probe and the calibration substrate relatively moved on a vertical axis for an overdrive to make the probe tip skate on the calibration substrate to generate a skate distance, and using an optical image-forming device to observe and obtain the skate distance; and
- generating the SD-OD relation dataset with the controller based on the aforementioned skate distance and overdrive.

As a result, the user can provide various overdrives to perform the respective measurements at the calibration substrate to obtain the respective corresponding skate distances, so as to establish this SD-OD relation dataset in the controller. Afterward, when the probe whose type corresponds to this dataset is to be used to test the contact pad whose type corresponds to this dataset, the already established SD-OD relation dataset can be directly used to conveniently and quickly obtain the required probing parameters, thereby enabling the probing assembly to generate great and consistent testing performance.

The present invention further provides a method of operating a probe system, which corresponds to the above-described situation of performing the positioning by using the probe contact position. The probe system includes a probing assembly and a controller. The probing assembly includes a probe. The probe includes a probe tip for probing a contact pad of a DUT. The method of operating the probe system includes the steps of:

- performing, with the controller, the above-described method of determining the probing parameters for the probe system to test the DUT;
- positioning the probe tip of the probe at the probe contact position with the controller; and
- performing, with the controller, an overdrive ON process which makes the probing assembly and the DUT relatively moved for the aforementioned overdrive value, so as to deflect the probe tip of the probe to skate to and then stop at the probe target position.

Through this operating method, accurate probing parameters can be obtained conveniently and quickly. Thereafter, using the probe contact position to perform the positioning and then using the overdrive value to perform the probing can allow the probing assembly to produce great and consistent testing performance, thereby achieving high testing accuracy.

The present invention further provides a method of operating a probe system, which corresponds to the above-described situation of performing the positioning by using the relative target position. The probe system includes a probing assembly and a controller. The probing assembly includes a probe. The probe includes a probe tip for probing a contact pad of a DUT. The method of operating the probe system includes the steps of:

- performing, with the controller, the above-described method of determining the probing parameters for the probe system to test the DUT;
- moving relatively the relative target position to the aforementioned position corresponding to the contact pad of the DUT with the controller; and
- performing, with the controller, an overdrive ON process which is making the probing assembly and the DUT relatively moved for the overdrive value, so as to deflect the probe tip of the probe to skate to and stop at the aforementioned position corresponding to the contact pad of the DUT.

Through this operating method, accurate probing parameters can be obtained conveniently and quickly. Thereafter, using the relative target position to perform the positioning and then using the overdrive value to perform the probing can allow the probing assembly to provide great and consistent testing performance, thereby achieving high testing accuracy.

The present invention further provides a probe system which includes a chuck, a probing assembly, an optical image-forming device, and a controller. The chuck includes a chuck support surface configured to support a substrate. The substrate includes one or more DUTs. The probing assembly includes a probe. The probe includes a probe tip. The probe is configured to test the DUT. The optical image-forming device is configured to receive the optical image of at least a part of the probe system, including the image of at least a part of the probing assembly. The controller is programmed to perform the above-described method of determining the probing parameters for the probe system to test the DUT.

With this probe system, accurate probing parameters can be obtained conveniently and quickly to enable the probing assembly to provide great and consistent testing performance, thereby achieving high testing accuracy.

The present invention further provides a non-transitory computer-readable storage media which includes computer-executable instructions that, when executed, direct a probe system to perform the above-described method of determining the probing parameters for the probe system to test the DUT.

With this non-transitory computer-readable storage media, accurate probing parameters can be obtained conveniently and quickly to enable the probing assembly to provide great and consistent testing performance, thereby achieving high testing accuracy.

The present invention further provides a method of testing an unpackaged semiconductor device, which includes the steps of:

providing at least one probing assembly, the at least one probing assembly including a probe, the probe including a probe tip, the probe tip of the probe being configured to mechanically and electrically contact an unpackaged semiconductor device;

providing a controller programmed to perform the above-described method of determining the probing parameters for the probe system to test the DUT to obtain a result; and according to the result, testing the unpackaged semiconductor device with the controller and via the probe.

Through the method of testing the unpackaged semiconductor device, accurate probing parameters can be obtained conveniently and quickly to enable the probing assembly to provide great and consistent testing performance, thereby achieving high testing accuracy.

The present invention further provides a method of producing a tested semiconductor device, which includes the steps of:

providing at least one probing assembly, the at least one probing assembly including a probe, the probe including a probe tip, the probe tip of the probe being configured to mechanically and electrically contact an unpackaged semiconductor device;

providing a controller programmed to perform the above-described method of determining the probing parameters for the probe system to test the DUT to obtain a result; and according to the result, testing the unpackaged semiconductor device with the controller and via the probe.

The semiconductor device produced through this method has been tested in a way with great accuracy, thereby having ensured properties.

The present invention further provides a tested semiconductor device which includes an unpackaged semiconductor device including a plurality of contact pads. The unpackaged semiconductor device has been tested through a testing process which performs the above-described method of determining the probing parameters for the probe system to test the DUT to obtain a result, and then making the contact pads mechanically and electrically contacted according to the result.

As a result, the semiconductor device has been tested in a way with great accuracy, thereby having ensured properties.

The present invention further provides a method of generating a virtual mark image which represents a portion of a probe system. The probe system includes a probe and a substrate. The substrate includes one or more DUTs. The probe is configured to test the DUT. The method includes the steps of:

obtaining, with an optical image-forming device, a present probe system image of at least a part of the probe system, the present probe system image includes one or both of:

the image of at least a part of the probe; and the image of at least a part of the substrate;

generating the virtual mark image with a controller based on at least a part of the present probe system image; and presenting the virtual mark image with a display;

wherein the virtual mark image includes one of:

a representation of a probe contact position, the probe contact position being the position, at which a probe tip of the probe is predetermined to start contacting a contact pad of the DUT; and a representation of a probe target position, the probe target position being the position, at which the probe tip of the probe is predetermined to be stopped after skating on the contact pad.

As a result, the representation of the probe contact position may be, for example, the aforementioned virtual alignment mark showing the probe contact position. The representation of the probe target position may be, for example, the aforementioned virtual alignment mark showing the relative target position. Even though the optical image-forming device cannot clearly show the contact pad of the DUT and the probe tip of the probe at the same time, the user can still perform the manual alignment to the probe and the DUT through the virtual mark image. Alternatively, in the automatically positioning condition, the user can know the present situation through the virtual mark image.

Preferably, the controller obtains, based on one of a skate distance value and an overdrive value and a skate distance to overdrive relation dataset, the other of the skate distance value and the overdrive value, and obtains, based on the skate distance value and the probe target position, the probe contact position.

In other words, in the above-described method of generating the virtual mark image, the probe contact position can be obtained by using the above-described method of determining the probing parameters for the probe system to test the DUT, so as to show the probe contact position in the virtual mark image for the manual alignment or automatic alignment between the probe and the DUT.

Preferably, the controller obtains, based on one of a skate distance value and an overdrive value and a skate distance to overdrive relation dataset, the other of the skate distance value and the overdrive value, and obtains, based on the skate distance value and a present probe position, a relative target position. The present probe position is the present position of the probe tip of the probe. The relative distance between the relative target position and the present probe position equals to the skate distance value.

In other words, in the above-described method of generating the virtual mark image, the relative target position can be obtained by using the above-described method of determining the probing parameters for the probe system to test the DUT, so as to show the relative target position in the virtual mark image for the manual alignment or automatic alignment between the probe and the DUT.

Preferably, in the present probe system image, the DUT is clearer than at least the probe tip of the probe. The aforementioned generating the virtual mark image includes generating a virtual alignment mark showing the probe contact position.

As a result, even though the optical image-forming device cannot clearly show the probe tip and the DUT, as long as the DUT is clear in the obtained present probe system image, the probe target position can be defined through the image and the probe contact position can be calculated accordingly, so as to make the virtual mark image include the virtual alignment mark showing the probe contact position. In this way, the user can perform the manual alignment to align the probe tip with the virtual alignment mark to position the probe tip at the probe contact position accurately. In the automatically positioning condition, the virtual alignment mark can be also provided for the user to know the present situation.

Preferably, in the present probe system image, at least the probe tip of the probe is clearer than the DUT. The aforementioned generating the virtual mark image includes generating a virtual alignment mark showing a relative target position. The relation between the relative target position and the present position of the probe tip is identical to the relation between the probe target position and the probe contact position.

As a result, even though the optical image-forming device cannot clearly show the probe tip and the DUT, as long as the probe tip is clear in the obtained present probe system image, the present probe position can be defined through the image and the relative target position can be calculated accordingly, so as to make the virtual mark image include the virtual alignment mark showing the relative target position. In this way, the user can perform the manual alignment to relatively move the relative target position to the probe stopped position decided by the user, so as to position the probe tip at the proper probe contact position.

Preferably, the aforementioned generating the virtual alignment mark includes determining the relative position of the virtual alignment mark with respect to the probe tip of the probe. The aforementioned generating the virtual mark image includes altering, based on at least a part of the determined relative position of the virtual alignment mark with respect to the probe tip, the virtual mark image to make the virtual mark image include the virtual alignment mark.

As a result, no matter in the above-described situation of generating the virtual alignment mark showing the probe contact position or the above-described situation of generating the virtual alignment mark showing the relative target position, the position of the probe tip can be obtained with the optical image-forming device and the relative position of the virtual alignment mark with respect to the probe tip can be determined accordingly, so that the virtual mark image can be added with the virtual alignment mark.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION OF THE INVENTION

Figure 1A:
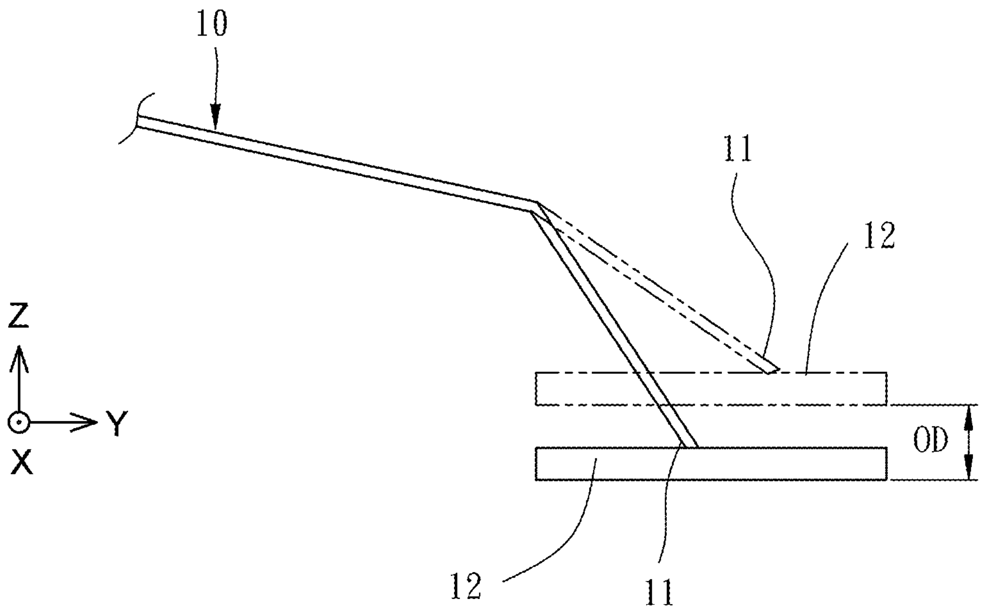
FIG. 1A PRIOR ART
FIG. 1A and FIG. 1B are respectively a schematic side view and a schematic top view showing a contact pad of a DUT being probed by a probe tip of a probe of a conventional probing assembly.

First of all, it is to be mentioned that same or similar reference numerals used in the following embodiments and the appendix drawings designate same or similar elements or the structural features thereof throughout the specification for the purpose of concise illustration of the present invention. It should be noticed that for the convenience of illustration, the components and the structure shown in the figures are not drawn according to the real scale and amount, and the features mentioned in each embodiment can be applied in the other embodiments if the application is possible in practice. Besides, when it is mentioned that an element is disposed on another element, it means that the former element is directly disposed on the latter element, or the former element is indirectly disposed on the latter element through one or more other elements between aforesaid former and latter elements. When it is mentioned that an element is directly disposed on another element, it means that no other element is disposed between aforesaid former and latter elements.

Figure 2:
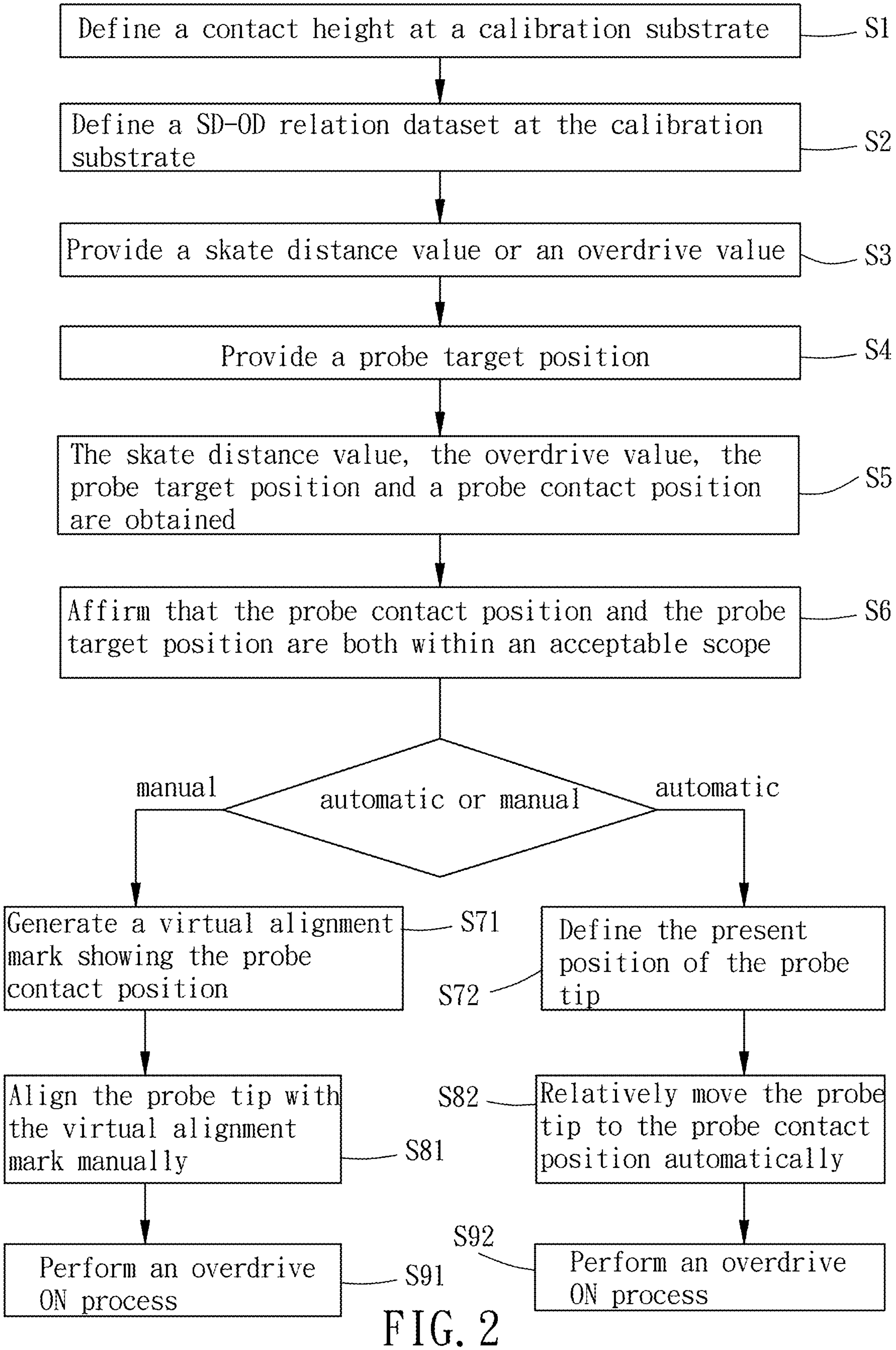
FIG. 2 is a flow chart of a method of operating a probe system according to a first preferred embodiment of the present invention.
Figure 3:
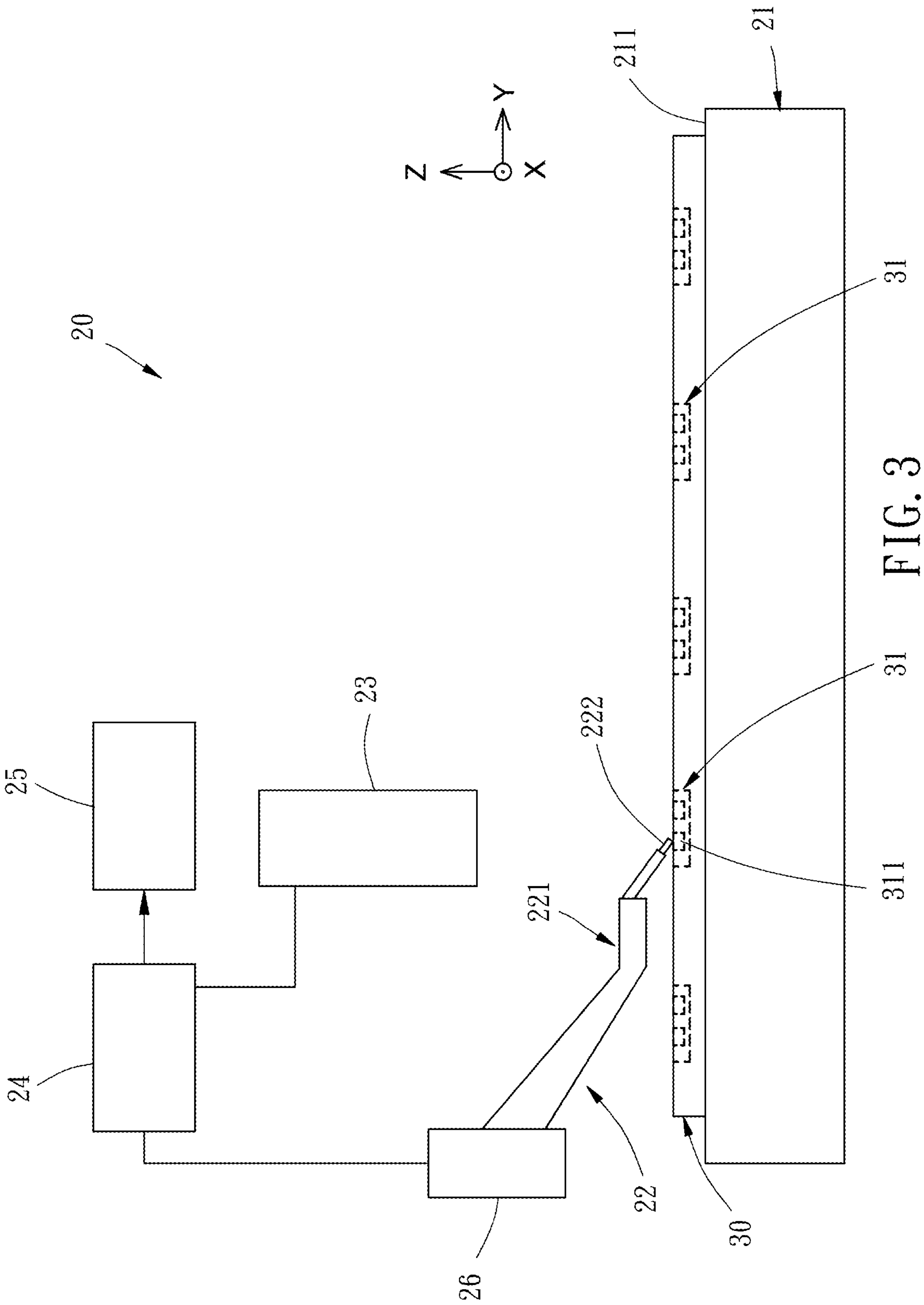
FIG. 3 is a schematic view of a probe system provided by the present invention.

Referring to FIG. 2 and FIG. 3, a first preferred embodiment of the present invention provides a method of operating a probe system 20. The probe system 20 includes a chuck 21, a probing assembly 22, an optical image-forming device 23, a controller 24, a display 25, and an electrically actuated positioning assembly 26. The probe system 20 is defined with two horizontal axes, i.e. X-axis and Y-axis, and a vertical axis, i.e. Z-axis.

The chuck 21 includes a chuck support surface 211 along the X-axis and the Y-axis. The chuck support surface 211 is configured to support a substrate 30, such as a wafter. The substrate 30 includes one or more DUTs 31, such as unpackaged semiconductor devices sliced from the wafer. The DUT 31 includes a plurality of contact pads 311.

The probing assembly 22 includes a probe 221. The probe 221 includes a probe tip 222. The probe tip 222 of the probe 221 is configured to mechanically and electrically contact the contact pad 311 of the DUT 31, thereby testing the DUT 31. According to the testing requirements, the probe 221 may include any proper number of probe tip 222, such as one probe tip 222, two probe tips 222, three probe tips 222, or more than three probe tips 222. A common arrangement of two probe tips 222 includes a signal probe tip and a ground probe tip, also referred to as a GS (ground-signal) probe tip configuration. A common arrangement of three probe tips 222 includes a centrally located signal probe tip flanked by a pair of ground probe tips, also referred to as a GSG (ground-signal-ground) probe tip configuration.

The optical image-forming device 23 is configured to receive the optical image of at least a part of the probe system 20, including the image of at least a part of the probing assembly 22, especially the probe tip 222, and usually also including the image of at least a part of the substrate 30, especially the contact pad 311 of the DUT 31.

The controller 24 is electrically connected with the optical image-forming device 23 for obtaining the image received by the optical image-forming device 23. The controller 24 is programmed to perform the method of operating the probe system 20 as shown in FIG. 2. The controller 24 is also electrically connected with the display 25 for showing the image related to the operation of the probe system 20 on the display 25. The images shown on the display 25 during the operation of the probe system 20 of this embodiment are schematically drawn as FIG. 4 to FIG. 9, which will be specified hereinafter.

The electrically actuated positioning assembly 26 is connected with the probing assembly 22, and the electrically actuated positioning assembly 26 is also electrically connected with the controller 24. According to the testing requirements, the controller 24 controls the electrically actuated positioning assembly 26, so as to control the probing assembly 22 to move along the X-axis, Y-axis and Z-axis. In the present invention, the probing assembly 22 and the DUT 31 are relatively moved, which may be performed in a way that the electrically actuated positioning assembly 26 drives the probing assembly 22 to move, or another moving device (not shown) drives the chuck 21 to move. Therefore, the probe system 20 in the present invention is unlimited to include the electrically actuated positioning assembly 26 connected with the probing assembly 22.

In the method of operating the probe system 20 in this embodiment, a method of determining probing parameters for the probe system to test the DUT is performed at first, which includes the following step a) to step f).

a) Define a skate distance to overdrive relation dataset according to the type of the probe 221 of the probing assembly 22 of the probe system 20 and the type of the contact pad 311 of the DUT 31, wherein the skate distance is along the X-axis and/or Y-axis and the overdrive is along the Z-axis.

Figure 15:
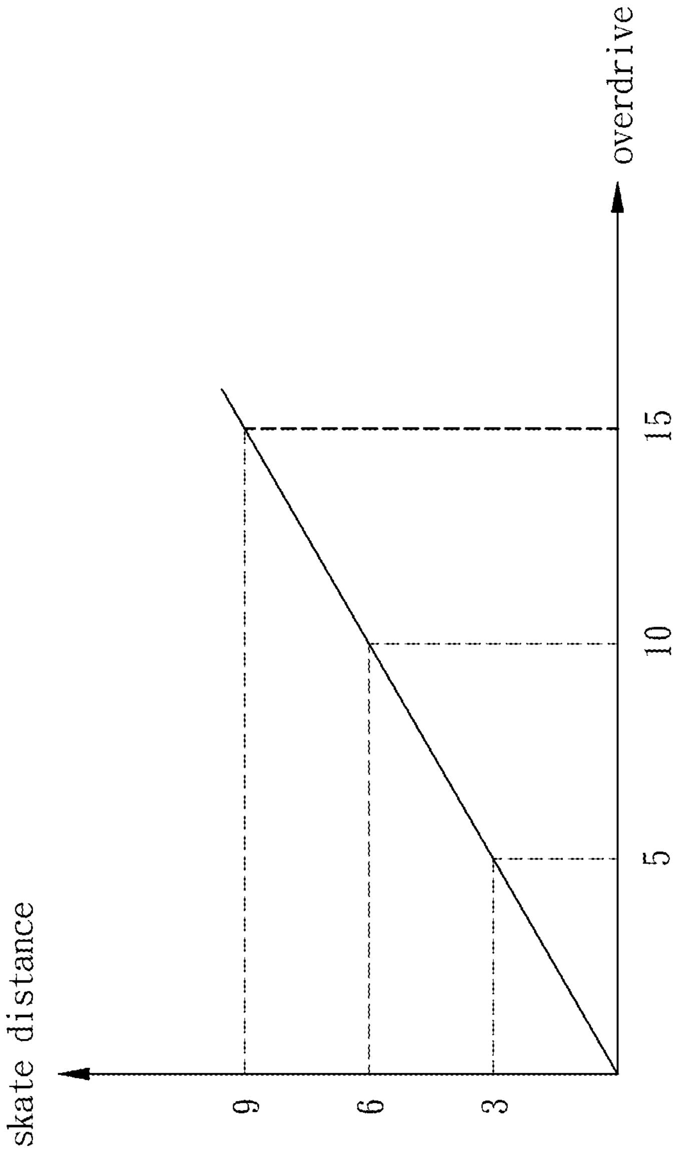
FIG. 15 is a schematic diagram of a SD-OD relation dataset.

It should be mentioned here that different probe type, such as probe thickness, material, shape, and so on, and/or different contact pad type, such as contact pad material, and so on, will cause different relation between the skate distance and the overdrive, thereby corresponding to different SD-OD relation dataset. The SD-OD relation dataset, such as the diagram shown in FIG. 15, can be a build-in dataset pre-established in the controller 24 by the manufacturer of the probe system 20, or can be established into the controller 24 by the user of the probe system 20 by a process referred to as an initial setup stage. The steps of this initial setup stage are included in the method of operating the probe system 20 shown in FIG. 2, which are the steps S1-S2 described in detail hereinafter.

Figure 4:
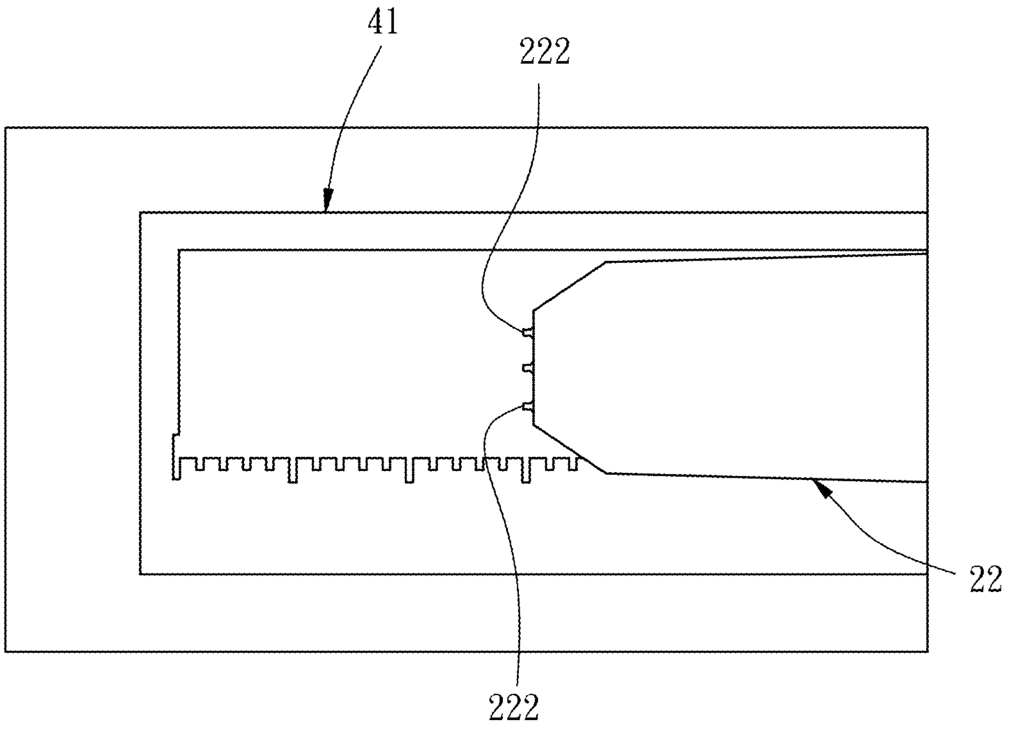
FIG. 4 to FIG. 9 are schematic views of the images showing the process of the method of operating the probe system according to the first preferred embodiment of the present invention, taken above the probe system along the Z-axis.

As shown in FIG. 2 and FIG. 4, the step S1 is defining a contact height at a calibration substrate 41. The contact height will be the Z-axial position of the probe tips 222 initially contacting the contact pads 311 of the DUT 31, which means when located at the contact height, the probe tips 222 start contacting the contact pads 311 of the DUT 31 without being deflected by the overdrive. This step is making the probing assembly 22 and the calibration substrate 41 relatively moved along the Z-axis to the status that the probe tips 222 are in contact with the calibration substrate 41, so as to find out and record the contact height for accordingly setting the overdrive value required for the test thereafter.

As shown in FIG. 2, the step S2 is defining a SD-OD relation dataset at the calibration substrate 41. The calibration substrate 41 includes a plurality of parallelization patterns (not shown) representing contact pads of different types respectively. This step is using the probing assembly 22 of the probe system 20 to perform the test in the area of the parallelization pattern of the calibration substrate 41, which is the same in type with the contact pad 311 of the DUT 31. That is making the probe tip 222 in contact with the parallelization pattern of the calibration substrate 41 and then making the probing assembly 22 and the calibration substrate 41 relatively moved on the Z-axis for an overdrive to make the probe tip 222 skate on the calibration substrate 41 to generate a skate distance. During the above-described skating, the probe tip 222 and the calibration substrate 41 are on the same X-Y plane, enabling the optical image-forming device 23 to take the clear image of the probe tip 222 and the calibration substrate 41 at the same time, so the skate distance can be observed and obtained with the optical image-forming device 23. The user can provide a plurality of different overdrives to perform the respective measurements at the calibration substrate 41 to obtain the respective corresponding skate distances, and then generate the SD-OD relation dataset with the controller 24 based on at least a part of the observed and obtained skate distances and their corresponding overdrives. After the SD-OD relation dataset is established in the controller 24, when the probe 221 whose type corresponds to this dataset is to be used to test the contact pad 311 whose type corresponds to this dataset, the already established SD-OD relation dataset can be directly used, so that in the following steps, the required probing parameters can be obtained conveniently and quickly.

b) As the step S3 shown in FIG. 2, provide one of a skate distance value and an overdrive value to the controller 24. The skate distance value is the distance, for which the probe tip 222 of the probe 221 is set to skate on the contact pad 311 of the DUT 31 along the X-axis or Y-axis after contacting the contact pad 311. The overdrive value is the distance, for which the probing assembly 22 and the DUT 31 are set to be relatively moved along the Z-axis after the probe tip 222 of the probe 221 contacts the contact pad 311 of the DUT 31.

Figure 1B:
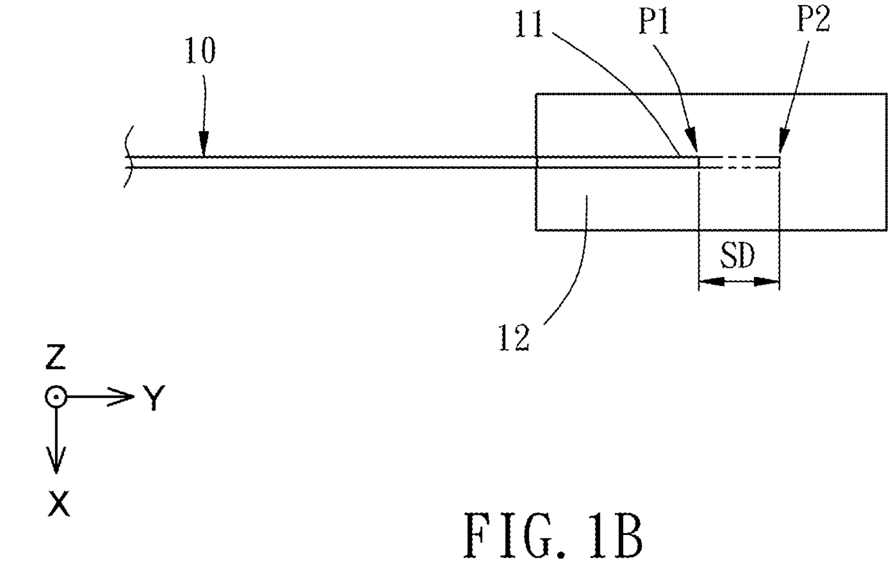
FIG. 1B PRIOR ART
Figure 5:
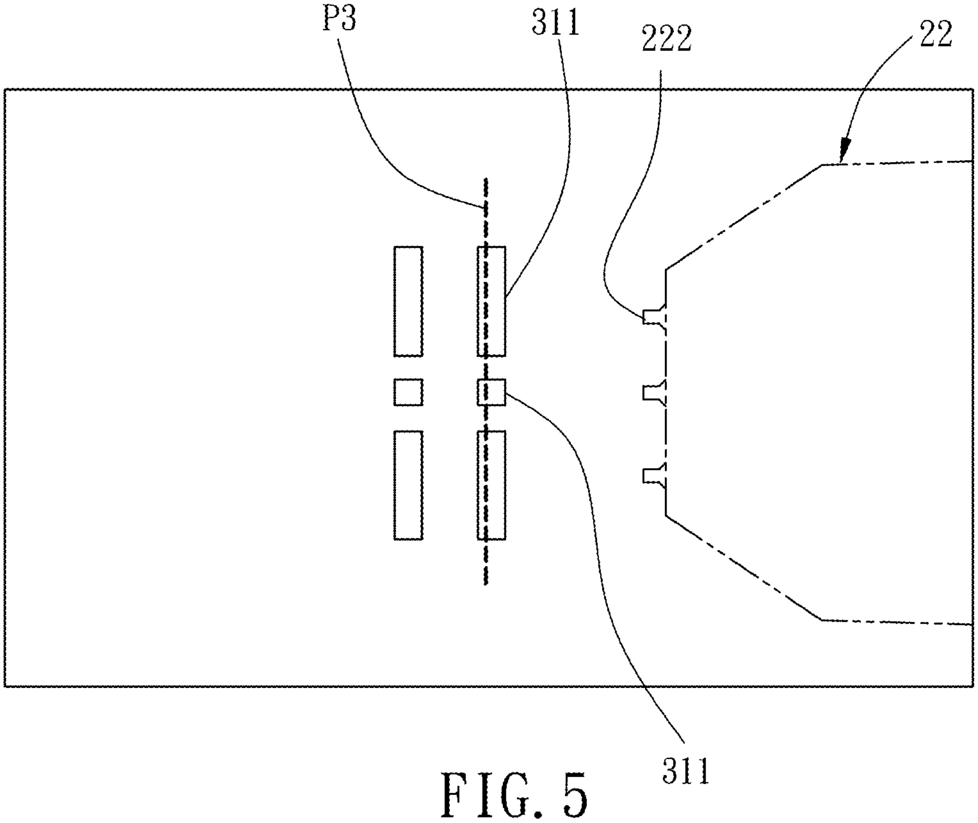

The skate distance and the overdrive mentioned in the present invention are the same in definition with the skate distance SD and the overdrive OD mentioned in the description of the related art as shown in FIG. 1A and FIG. 1B. The skate distance value and the overdrive value are numeral values set for the skate distance and the overdrive for the controller 24 to perform the related calculation and control.

c) As the step S4 shown in FIG. 2, provide a probe target position P3 as shown in FIG. 5 to the controller 24. The probe target position P3 is the position, at which the probe tip 222 of the probe 221 is predetermined to be stopped after skating on the contact pad 311 of the DUT 31. In this embodiment, the stop position is also the position, at which the probing assembly 22 performs the test (electrical property test) to the DUT 31.

Figure 10:
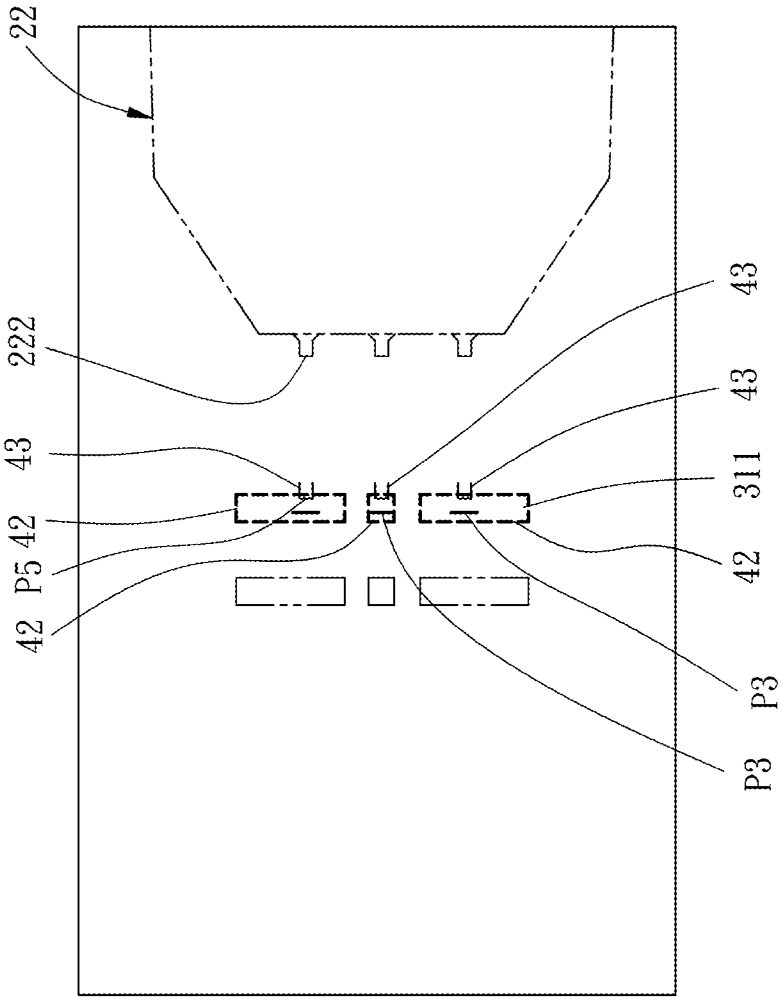
FIG. 10 is similar to FIG. 7, but showing virtual alignment marks of a different type, and further showing probe target positions and acceptable scopes of contact pads of a DUT.

The user can firstly move the chuck 21 or the FOV of the optical image-forming device 23 to make the optical image-forming device 23 roughly find out the contact pad 311, and then fine adjust the FOV of the optical image-forming device 23 on the Z-axis to focus on the contact pad 311, thereby obtaining a clear image of the contact pad 311. After that, the user can define the probe target position P3 on the image for the controller 24 to receive the numeral value of the probe target position P3, and may even show the probe target position P3 on the image. The probing assembly 22 in this embodiment includes three probe tips 222 for testing three contact pads 311 of the DUT 31. Since the three probe tips 222 are displaced simultaneously, this embodiment only uses a dotted line to represent the probe target positions P3 of the three probe tips 222 collectively. However, the probe target positions P3 of the three probe tips 222 may be shown individually, as shown in FIG. 10. Since the optical image-forming device 23 focuses on the contact pad 311 in this step, the image of the probing assembly 22 is relatively more blurred. Therefore, the probing assembly 22 is represented by imaginary lines in FIG. 5.

Figure 6:
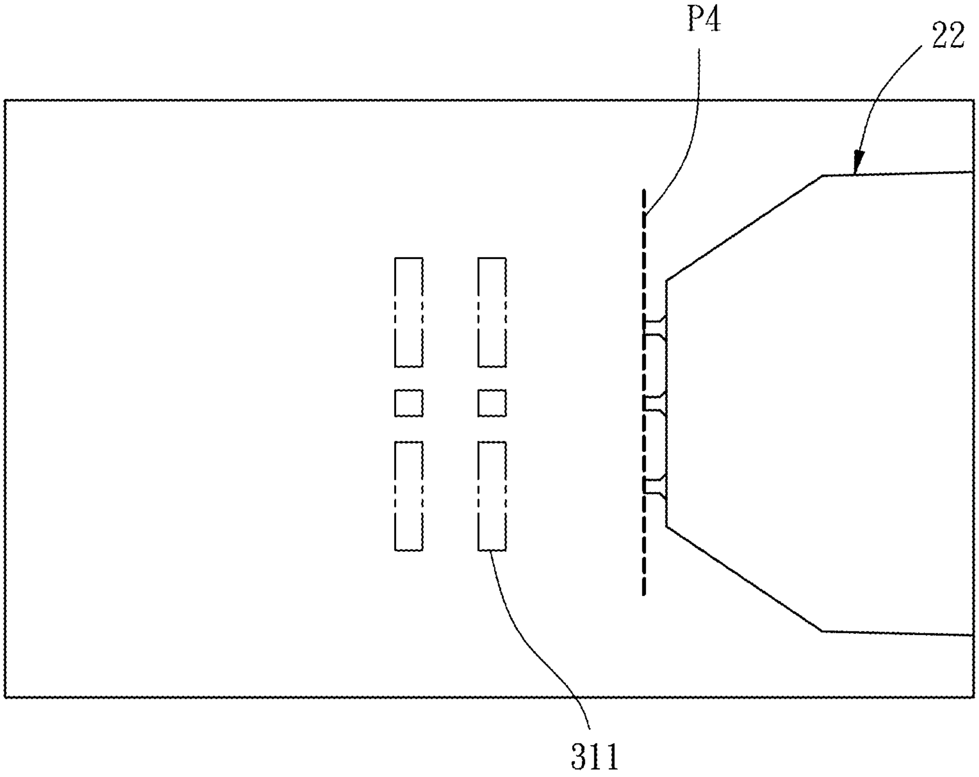

As shown in FIG. 6, a present probe position P4 may, but unlimited to, be further defined in this embodiment. The present probe position P4 is the present position of the probe tip 222. The user can firstly move the probing assembly 22 or the FOV of the optical image-forming device 23 to make the optical image-forming device 23 roughly find out the probe tips 222, and then fine adjust the FOV of the optical image-forming device 23 on the Z-axis to focus on the probe tips 222, thereby obtaining a clear image of the probe tips 222. After that, the user can define the present probe position P4 on the image for the controller 24 to receive the numeral value of the present probe position P4, and may even show the present probe position P4 on the image. This embodiment only uses a dotted line to represent the present probe positions P4 of the three probe tips 222 collectively. However, the present probe positions P4 of the three probe tips 222 may be shown individually. Since the optical image-forming device 23 focuses on the probe tips 222 in the process of defining the present probe position P4, the image of the contact pads 311 is relatively more blurred. Therefore, the contact pads 311 are represented by imaginary lines in FIG. 6. The sequence of the step of defining the probe target position P3 as shown in FIG. 5 and the step of defining the present probe position P4 as shown in FIG. 6 can be interchanged.

d) Obtain, with the controller 24 and based on the aforementioned one of the skate distance value and the overdrive value provided in the step b) and the SD-OD relation dataset defined in the step a), the other of the skate distance value and the overdrive value. In other words, as long as the user provides the skate distance value to the controller 24, the controller 24 can obtain the overdrive value through the SD-OD relation dataset. Alternatively, as long as the user provides the overdrive value to the controller 24, the controller 24 can obtain the skate distance value through the SD-OD relation dataset.

Figure 7:
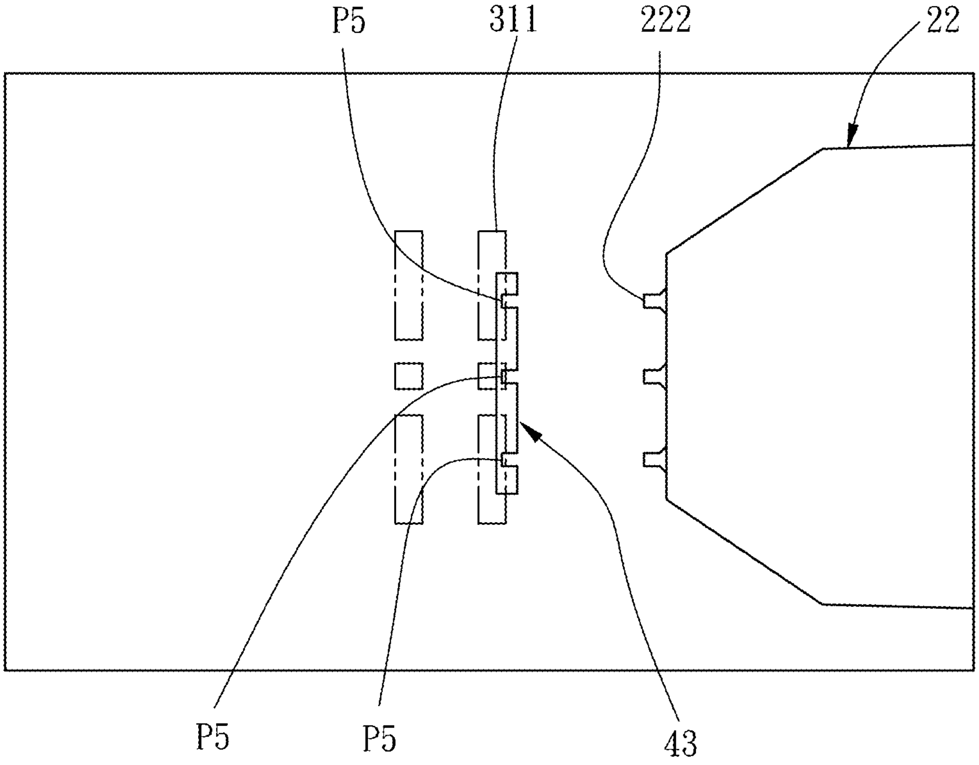

This step further obtains, with the controller 24 and based on the skate distance value and the probe target positions P3 provided in the step c), probe contact positions P5 as shown in FIG. 7. The probe contact positions P5 are the positions, at which the probe tips 222 are predetermined to start contacting the contact pads 311 of the DUT 31, for positioning the probing assembly 22 and the DUT 31 to each other in the step thereafter.

Figure 8:
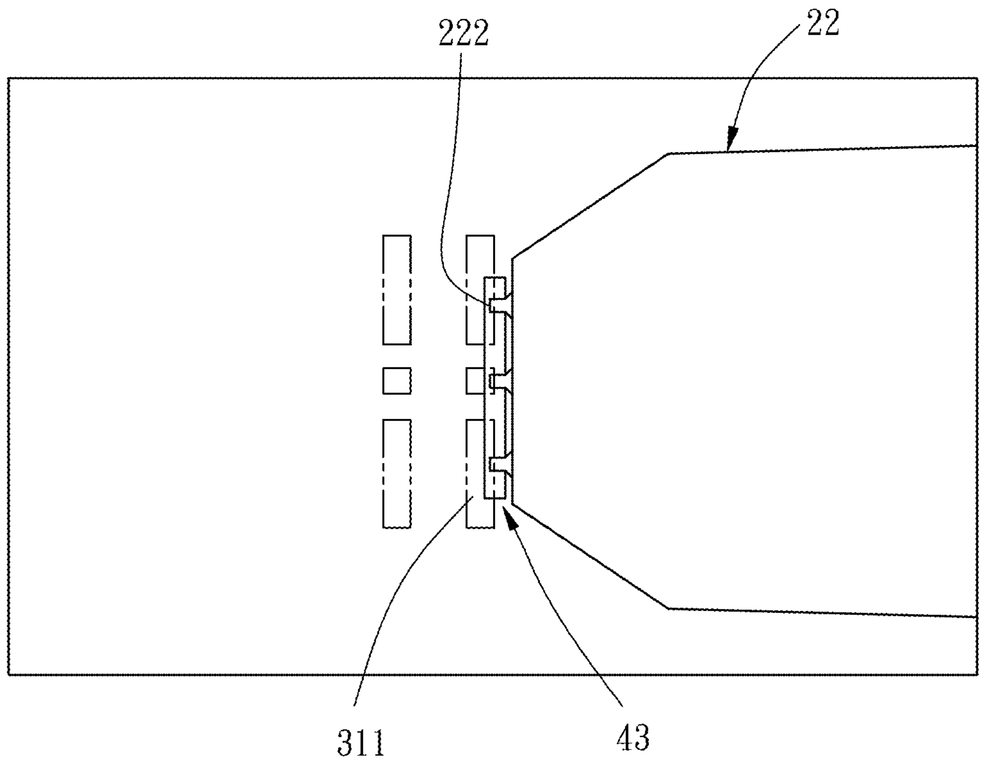

In other words, when this step finishes, the controller 24 has obtained the primary probing parameters required for the probe system 20 to test the DUT 31, which are the skate distance value, the overdrive value, the probe target position P3 and the probe contact position P5, as the step S5 shown in FIG. 2.

e) As the step S6 shown in FIG. 2, after the probe contact position P5 and the probe target position P3 are both known, it can be further affirmed whether the two positions are both located within an acceptable scope corresponding in position to the contact pad 311 of the DUT 31. As shown in FIG. 10, the acceptable scope 42 may equal to the scope of the contact pad 311, or may be smaller than the scope of the contact pad 311. The controller 24 can judge, by calculation, whether the probe contact position P5 and the probe target position P3 are both within the acceptable scope 42, and can also show the probe contact position P5, the probe target position P3 and the acceptable scope 42 in the image for the user to affirm that. This step is arranged to ensure that the probe tip 222 will be positively contacted against the contact pad 311 of the DUT 31 in the entire process of the overdrive and produce a proper probe scratch, thereby ensuring and enhancing the testing accuracy. However, this step may be omitted.

f) As the step S71 shown in FIG. 2, generate, with the controller 24, a virtual alignment mark 43 showing the probe contact positions P5, as shown in FIG. 7, for the probe tips 222 to be aligned with the virtual alignment mark 43, as shown in FIG. 8.

According to different operating manners, the virtual alignment mark 43 is optionally shown. In the manual operation, the virtual alignment mark 43 is shown on the display 25 for the user to align the probe tips 222 with the virtual alignment mark 43, as the step S81 shown in FIG. 2. At this time, even though only the image of the probe tips 222 is clear but the image of the contact pads 311 of the DUT 31 is blurred and unclear, the user can still align the probe tips 222 with the virtual alignment mark 43, so as to position the probe tips 222 at the probe contact positions P5 accurately. In the automatic operation, as long as the present positions of the probe tips 222, i.e. the present probe position P4 mentioned in the above-described step c), are defined, as the step S72 shown in FIG. 2, the probe system 20 can automatically make the probe tips 222 relatively moved to the probe contact positions P5, as the step S82 shown in FIG. 2. At this time, the virtual alignment mark 43 may be also shown on the display 25 for the user to know the present situation, or the virtual alignment mark 43 may be omitted and this step f) of generating the virtual alignment mark 43 may be even not performed.

In this embodiment, the probe contact positions P5 of the three probe tips 222 are shown by the same virtual alignment mark 43. However, the probe contact positions P5 of the three probe tips 222 may be shown by three virtual alignment marks 43 respectively, as shown in FIG. 10. The virtual alignment mark is unlimited in shape, which may be shaped correspondingly to different probe tip shapes, or may be shaped for only position recognition, such as the shape of the virtual alignment mark 43 shown in FIG. 12.

Figure 9:
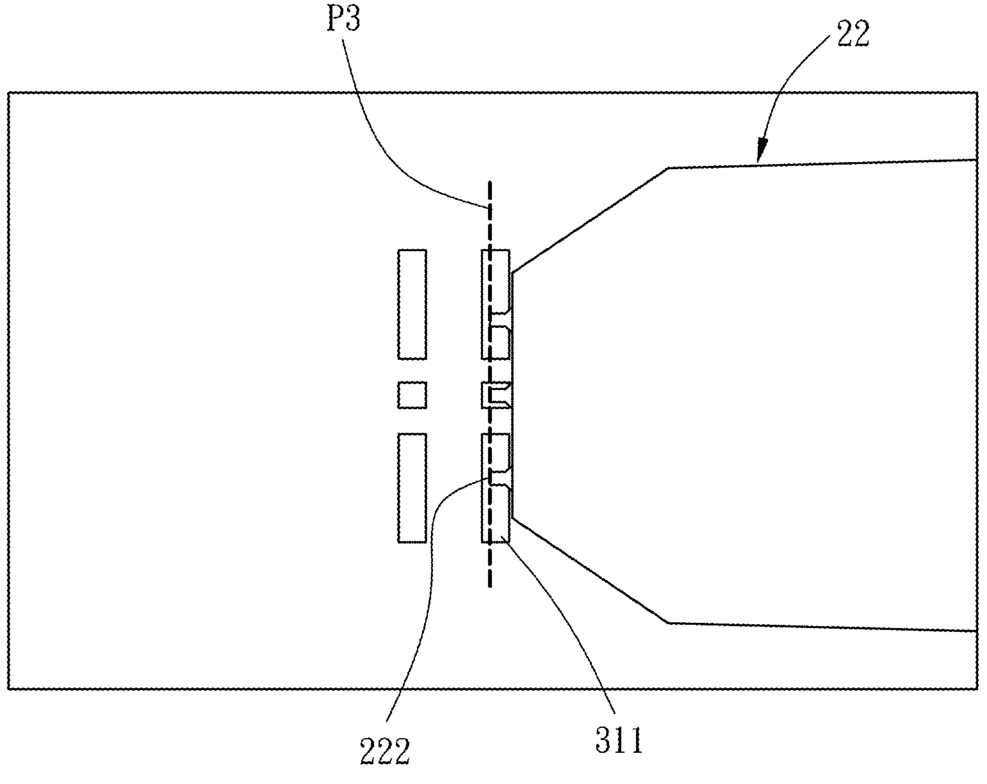

After the user positions the probe tips 222 at the probe contact positions P5 by using the virtual alignment mark 43, or after the probe tips 222 are automatically positioned at the probe contact positions P5 by the controller 24, an overdrive ON process can be performed with the controller 24, as the step S91 or S92 shown in FIG. 2. The overdrive ON process is making the probing assembly 22 and the DUT 31 relatively moved for the overdrive value provided in the step b) or obtained in the step d), making the probe tips 222 deflected to skate to and stop at the probe target position P3, as shown in FIG. 9. In this way, the probe tips 222 can be ensured to be stopped at the desired probe target position P3 when the overdrive ON process finishes.

Figure 11:
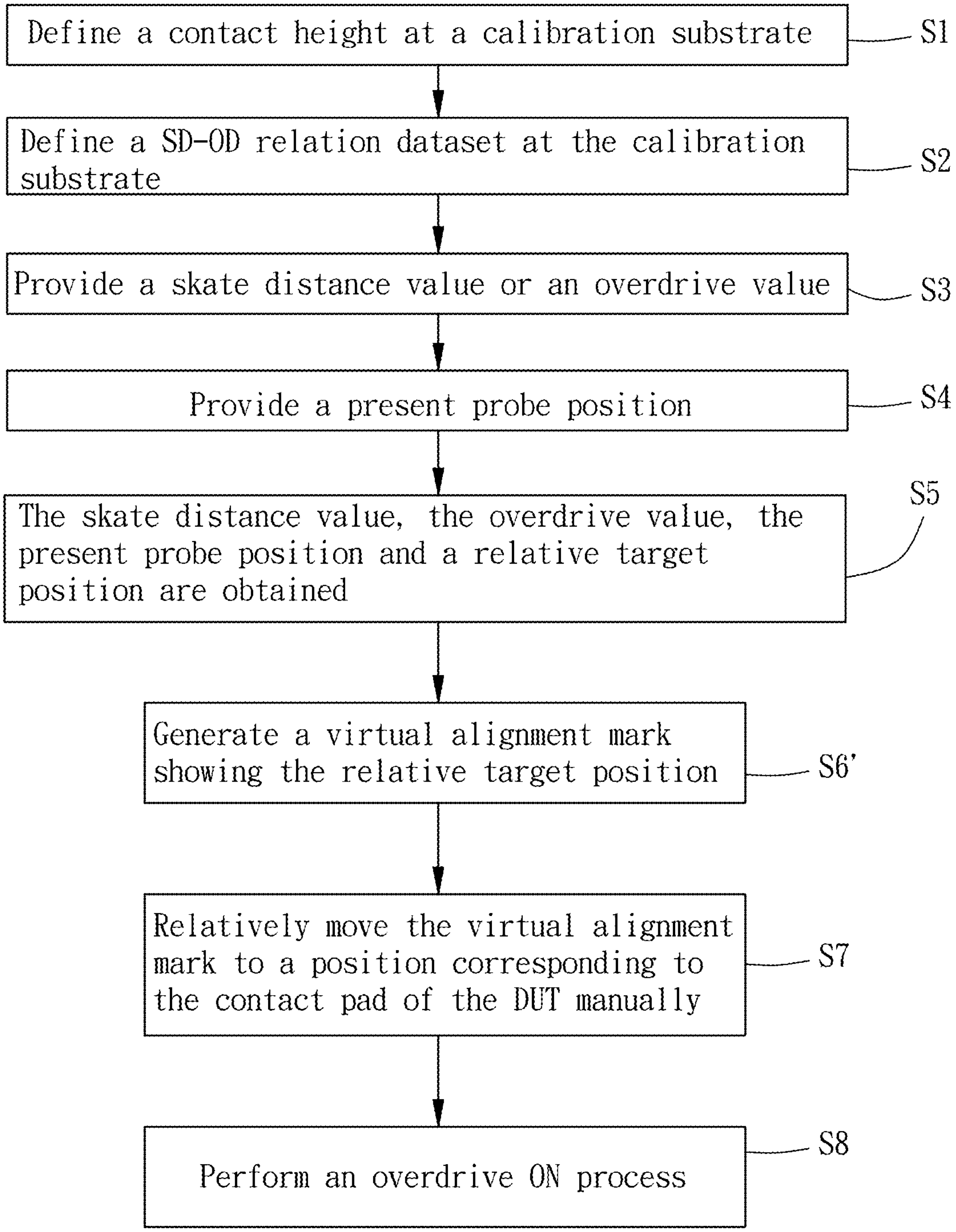
FIG. 11 is a flow chart of a method of operating a probe system according to a second preferred embodiment of the present invention.

Referring to FIG. 11, a method of operating the probe system 20 according to a second preferred embodiment of the present invention is similar to that in the first preferred embodiment, also firstly performing the method of determining the probing parameters for the probe system to test the DUT, then performing the manual operation to position the probing assembly 22 and the DUT 31 to each other, and then performing the overdrive ON process. However, compared with the first preferred embodiment, this embodiment has the following difference.

Figure 12:
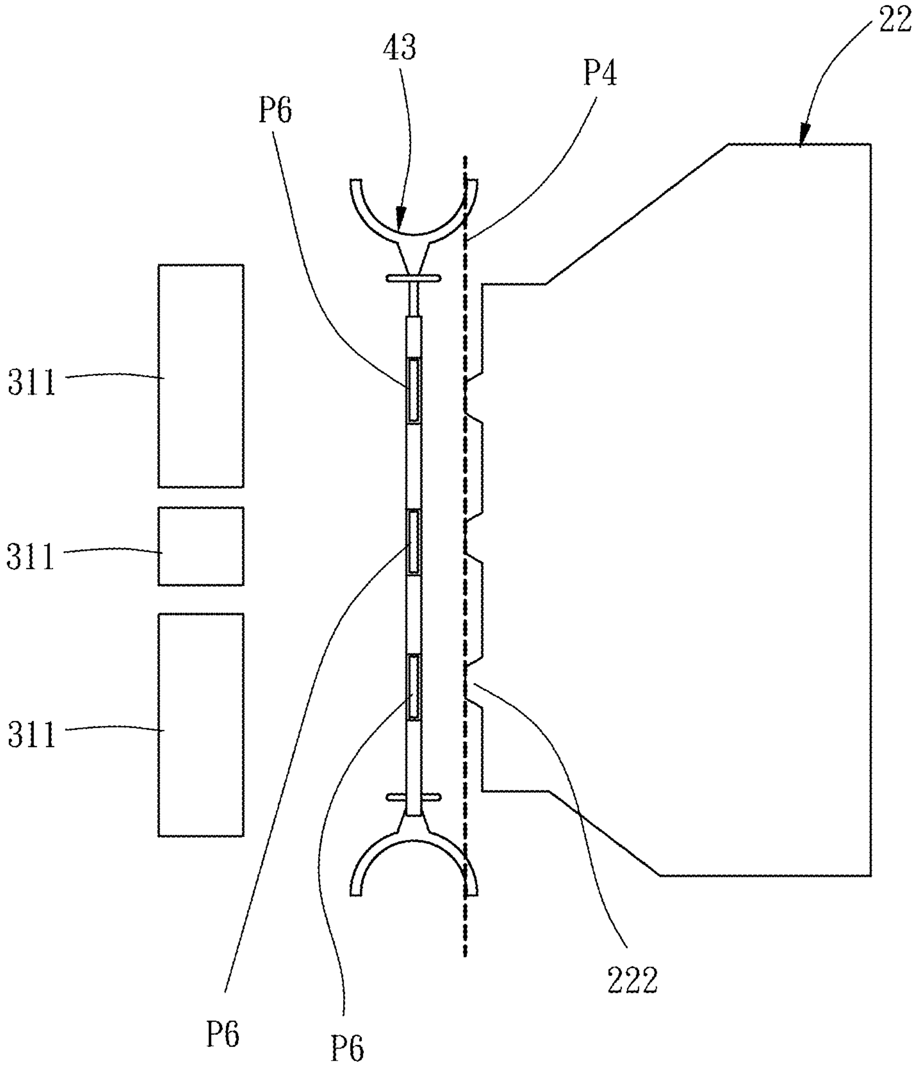
FIG. 12 to FIG. 14 are schematic views of the images showing the process of the method of operating the probe system according to the second preferred embodiment of the present invention.

Referring to FIG. 11 and FIG. 12, in this embodiment, the steps S1-S3, which are the same with those in the first preferred embodiment, are performed at first. After that, instead of providing the probe target position P3 to the controller, the present probe position P4 is provided to the controller 24 in the step S4, and the present probe position P4 may, but unlimited to, be shown on the image.

Based on the SD-OD relation dataset defined in the step S2 and the skate distance value or overdrive value provided in the step S3, the controller 24 can obtain both the skate distance value and the overdrive value, and then obtain a relative target position P6 by the calculation based on the skate distance value and the present probe position P4. The relative distance between the relative target position P6 and the present probe position P4 equals to the skate distance value, which means the relation between the relative target position P6 and the present probe position P4 is identical to the relation between the probe target position P3 and the probe contact position P5 described in the first preferred embodiment. Therefore, although the probe contact positions P5 are not obtained in this embodiment, as long as the relative target positions P6 are moved simultaneously with the probing assembly 22 relative to the DUT 31 and the relative target positions P6 are relatively moved to the positions, at which the probe tips 222 of the probing assembly 22 are predetermined to be stopped after skating on the contact pads 311 of the DUT 31, such as the equivalence of the probe target positions P3 described in the first preferred embodiment, the probe tips 222 will be relatively moved to the positions equivalent to the probe contact positions P5 described in the first preferred embodiment simultaneously, such that the probing assembly 22 and the DUT 31 can be positioned to each other.

In other words, in the step S5 in this embodiment, the controller 24 has obtained the primary probing parameters required for the probe system 20 to test the DUT 31, which are the skate distance value, the overdrive value, the present probe position P4, and the relative target position P6.

Figure 13:
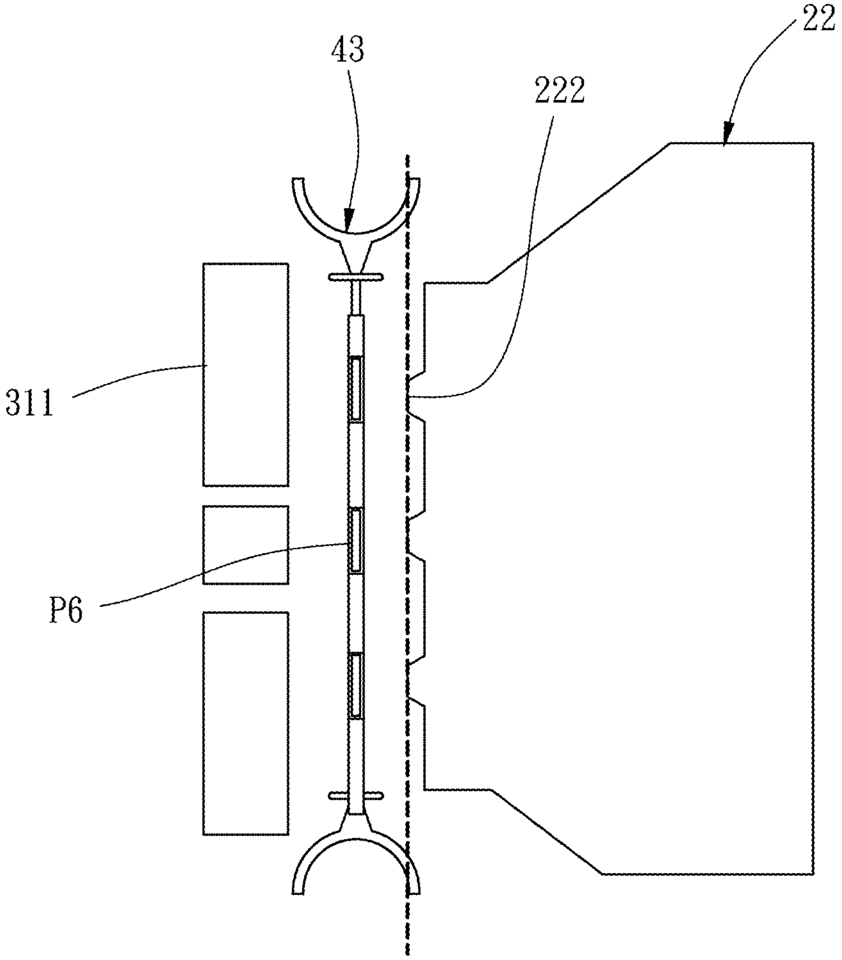
Figure 14:
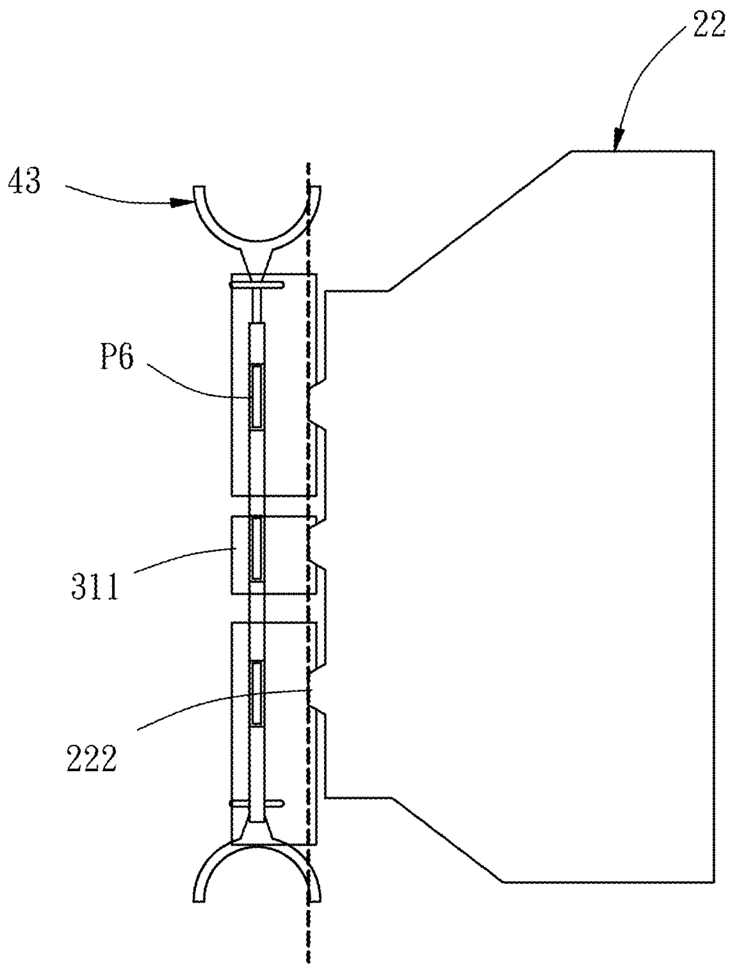

After that, as the step S6' shown in FIG. 11, a virtual alignment mark 43 showing the relative target position P6 can be generated with the controller 24. In the manual operation, the virtual alignment mark 43 is shown on the display 25 and moved simultaneously with the probing assembly 22 relative to the DUT 31 (as shown in FIG. 13) for the user to relatively move the virtual alignment mark 43 to a position corresponding to the contact pads 311 of the DUT 31 (as shown in FIG. 14), i.e. the step S7 shown in FIG. 11, so that the relative target positions P6 are relatively moved to the aforementioned position corresponding to the contact pads 311 of the DUT 31. More specifically speaking, the aforementioned position corresponding to the contact pads 311 of the DUT 31 is the position the user predetermines the probe tips 222 to be stopped after skating on the contact pads 311 of the DUT 31, similar to the probe target position P3 described in the first preferred embodiment but not set with numeral value and visually decided by the user during the operation. In the present invention, this position is also referred to as the probe stopped position decided by the user.

Further speaking, there are two ways of moving the relative target position P6 relative to the DUT 31. The first way is that the user operates the operating lever of the machine to control the probing assembly 22 to move. The relative target position P6 is moved simultaneously with the probing assembly 22. Meanwhile, the virtual alignment mark 43 is also moved on the display 25 simultaneously. The user can watch the moving condition of the virtual alignment mark 43 on the display 25 to control the movement of the probing assembly 22, so as to move the relative target position P6 (virtual alignment mark 43) to the desired position. The second way is that the user uses the mouse or the touch control function of the touch panel to drag the virtual alignment mark 43 on the display 25 to the desired position. Meanwhile, the probing assembly 22 can be moved simultaneously to make the relative target position P6 moved simultaneously with the virtual alignment mark 43. Alternatively, the probing assembly 22 can be moved after the user decides the position to stop the virtual alignment mark 43. The above two ways are both operated by the user, both belonging to the manual operation described in the present invention. It can be seen that the manual operation and the automatic operation described in the present invention are both performed with the controller 24.

During the above-described movement, even though only the image of the contact pads 311 of the DUT 31 is clear but the image of the probe tips 222 is blurred and unclear, the user can still align the virtual alignment mark 43 with the aforementioned position corresponding to the contact pads 311 of the DUT 31, i.e. the position the user predetermines the probe tips 222 of the probing assembly 22 to be stopped after skating on the contact pads 311 of the DUT 31, such as the probe target position P3 described in the first preferred embodiment, so as to locate the probe tips 222 at proper positions on the contact pads 311 of the DUT 31, such as the aforementioned probe contact position P5.

After the user positions the virtual alignment mark 43 at the position the probe tips 222 of the probing assembly 22 are predetermined to be stopped after skating on the contact pads 311 of the DUT 31, such as the probe target position P3 described in the first preferred embodiment, the overdrive ON process can be performed with the controller 24, as the step S8 shown in FIG. 11. The overdrive ON process is making the probing assembly 22 and the DUT 31 relatively moved for the overdrive value provided in the step S3 or obtained in the step S5, making the probe tips 222 deflected to skate to and then stop at the probe stopped position decided by the user. In this way, the probe tips 222 can be ensured to be stopped at the desired position when the overdrive ON process finishes.

It can be known from the above two embodiments that since the SD-OD relation dataset is established in the present invention, for performing the test, as long as the user provides the skate distance value or overdrive value and the probe target position P3 or present probe position P4, the parameters required for testing the DUT 31 with the probing assembly 22 can be obtained. It is unnecessary to perform, before every time of testing, the time-consuming initial setting steps, such as using the calibration substrate to find out the proper overdrive, performing many times of calibration measurement for the overdrive to obtain the initial contact position, and so on. Besides, the method of the present invention can provide accurate parameters to make sure that the probe tip 222 of the probe 221 will be stopped at the desired position after skating on the contact pad 311 of the DUT 31. Therefore, the method provided by the present invention not only saves time and offers convenience, but also enhances the testing accuracy by enabling the probing assembly to deliver consistent and excellent performance, thereby reducing wear on the probe and calibration substrate and extending their lifespan. The controller 24 may include and/or be any suitable structure, device, and/or devices that may be adapted, configured, designed, constructed, and/or programmed to perform the functions discussed herein. As examples, the controller 24 may include one or more of an electronic controller, a dedicated controller, a special-purpose controller, a personal computer, a special-purpose computer, a display device, a logic device, a memory device, and/or a memory device having computer-readable storage media.

The computer-readable storage media, when present, also may be referred to herein as non-transitory computer readable storage media. This non-transitory computer readable storage media may include, define, house, and/or store computer-executable instructions, programs, and/or code; and these computer-executable instructions may direct the probe system 20 and/or the controller 24 thereof to perform any suitable portion, or subset, of methods. Examples of such non-transitory computer-readable storage media include CD-ROMs, disks, hard drives, flash memory, etc. As used herein, storage, or memory, devices and/or media having computer-executable instructions, as well as computer-implemented methods and other methods according to the present disclosure, are considered to be within the scope of subject matter deemed patentable in accordance with Section 101 of Title 35 of the United States Code.

Therefore, the present invention also provides a non-transitory computer-readable storage media, which includes computer-executable instructions that, when executed, direct the probe system 20 to perform the aforementioned method of determining the probing parameters for the probe system to test the DUT to obtain the accurate probing parameters conveniently and quickly, enabling the probing assembly 22 to provide great and consistent testing performance, thereby achieving high testing accuracy.

It can be known from the above two embodiments that the present invention also provides a method of generating a virtual mark image representing a portion of the probe system 20, and the method includes the step of obtaining, with the optical image-forming device 23, a present probe system image of at least a part of the probe system 20, such as the image shown in FIG. 5. The present probe system image includes the image of at least a part of the probe 221, such as the probe tip 222, and/or the image of at least a part of the substrate 30, such as the contact pad 311 of the DUT 31. Then, generate a virtual mark image with the controller 24 based on at least a part of the present probe system image, and present the virtual mark image with the display 25, such as the image shown in FIG. 7. The virtual mark image includes a representation of the probe contact position or a representation of the probe target position.

In the first preferred embodiment, the virtual mark image includes the representation of the probe contact position, i.e. the virtual alignment mark 43 showing the probe contact position P5 as shown in FIG. 7. In the second preferred embodiment, the virtual mark image includes the representation of the probe target position, i.e. the virtual alignment mark 43 showing the relative target position P6 as shown in FIG. 12. The step of generating the virtual alignment mark 43 may include determining the relative position of the virtual alignment mark 43 with respect to the probe tip 222. For example, the position of the probe tip 222 can be obtained with the optical image-forming device 23 and the relative position of the virtual alignment mark 43 with respect to the probe tip 222 can be determined accordingly. The step of generating the virtual mark image may include altering, based on at least a part of the determined relative position of the virtual alignment mark 43 with respect to the probe tip 222, the virtual mark image to make the virtual mark image include the virtual alignment mark 43.

Further speaking, in the first preferred embodiment, since the probe target position P3 has to be provided, the probe tip 222 is more blurred than the DUT 31 in the aforementioned present probe system image. However, through the clear image of the DUT 31, the probe target position P3 can be defined and the probe contact position P5 can be calculated accordingly, allowing the virtual mark image to include the virtual alignment mark 43 showing the probe contact position P5. In this way, the user can perform the manual alignment to align the probe tip 222 with the virtual alignment mark 43, so as to position the probe tip 222 at the probe contact position P5 accurately. In the automatically positioning condition, the virtual alignment mark 43 can be also provided for the user to know the present situation. In another aspect, in the second preferred embodiment, since the present probe position P4 has to be provided, the probe tip 222 is clearer than the DUT 31 in the aforementioned present probe system image. Through the clear image of the probe tip 222, the present probe position P4 can be defined and the relative target position P6 can be calculated accordingly, allowing the virtual mark image to include the virtual alignment mark 43 showing the relative target position P6. In this way, the user can perform the manual alignment to relatively move the relative target position P6 to the probe stopped position decided by the user, so as to position the probe tip 222 at the proper probe contact position.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of operating a probe system, the probe system comprising a probing assembly and a controller, the probing assembly comprising a probe, the probe comprising a probe tip for probing a contact pad of a device under test, the method of operating the probe system comprising the steps of:

determining probing parameters for the probe system to test the device under test, comprising the substeps of:

defining, by a controller, a skate distance to overdrive relation dataset according to a type of the probe of the probing assembly of the probe system and a type of the contact pad of the device under test, wherein the skate distance to overdrive relation dataset is stored in a memory device and generated based on measurements obtained from a calibration substrate;

receiving, by the controller, one of a skate distance value and an overdrive value, the skate distance value being a distance, for which a probe tip of the probe is set to skate on the contact pad of the device under test after contacting the contact pad, the overdrive value being a distance, for which the probing assembly and the device under test are set to be relatively moved after the probe tip of the probe contacts the contact pad of the device under test;

receiving, by the controller, one of a probe target position and a present probe position, the probe target position being a position, at which the probe tip of the probe is predetermined to be stopped after skating on the contact pad of the device under test, the present probe position being a present position of the probe tip of the probe;

obtaining, by the controller, based on said one of the skate distance value and the overdrive value and the skate distance to overdrive relation dataset, the other of the skate distance value and the overdrive value, and obtaining, by the controller based on the skate distance value and said one of the probe target position and the present probe position, a probe contact position for positioning the probing assembly and the device under test to each other, wherein the controller is configured to calculate the skate distance value or the overdrive value using the skate distance to overdrive relation dataset;

positioning, by the controller via an actuated positioning assembly, the probe tip of the probe at the probe contact position; and performing, by the controller, an overdrive process to relatively move the probing assembly and the device under test by the obtained overdrive value, deflecting the probe tip to skate across the contact pad and stop at the probe target position.

2. The method as claimed in claim 1, wherein the probe target position is provided to the controller; said position for positioning the probing assembly and the device under test to each other is a probe contact position; the probe contact position is a position, at which the probe tip of the probe is predetermined to start contacting the contact pad of the device under test, for the probe tip of the probe to be positioned at the probe contact position.

3. The method as claimed in claim 2, wherein the method further comprises the step of:

affirming that both the probe contact position and the probe target position are both within an acceptable scope corresponding in position to the contact pad of the device under test.

4. The method as claimed in claim 2, wherein the method further comprises the step of:

generating, with the controller, a virtual alignment mark showing the probe contact position for the probe tip of the probe to be aligned with the virtual alignment mark.

5. The method as claimed in claim 1, wherein the present probe position is provided to the controller; said position for positioning the probing assembly and the device under test to each other is a relative target position, wherein a relative distance between the relative target position and the present probe position equals to the skate distance value, for positioning the probing assembly and the device under test to each other by making the relative target position and the probing assembly moved relative to the device under test simultaneously and making the relative target position relatively moved to a position corresponding to the contact pad of the device under test.

6. The method as claimed in claim 5, wherein the method further comprises the step of:

generating, with the controller, a virtual alignment mark showing the relative target position, for the virtual alignment mark to be relatively moved to said position corresponding to the contact pad of the device under test, so as to make the relative target position relatively moved to said position corresponding to the contact pad of the device under test.

7. The method as claimed in claim 1, wherein the skate distance to overdrive relation dataset is established with the probe system and the calibration substrate by a process comprising the steps of:

making the probe tip of the probe in contact with the calibration substrate;

making the probe and the calibration substrate relatively moved on a vertical axis for an overdrive to make the probe tip skate on the calibration substrate to generate a skate distance, and using an optical image-forming device to observe and obtain the skate distance; and generating the skate distance to overdrive relation dataset with the controller based on the skate distance and the overdrive.

8. A probe system comprising:

a chuck comprising a chuck support surface configured to support a substrate, the substrate comprising one or more devices under test;

a probing assembly comprising a probe, the probe comprising a probe tip configured to test the device under test;

an optical image-forming device configured to receive an optical image of at least a part of the probe system, including an image of at least a part of the probing assembly; and the controller, defined in claim 1, programmed to perform the method as claimed in claim 1.

9. A non-transitory computer-readable storage media comprising computer-executable instructions that, when executed, direct a probe system to perform the method as claimed in claim 1.

10. A method of testing an unpackaged semiconductor device, the method comprising the steps of:

providing at least one probing assembly, the at least one probing assembly comprising a probe, the probe comprising a probe tip configured to mechanically and electrically contact an unpackaged semiconductor device;

performing the method of operating the probe system as claimed in claim 1, wherein the device under test is an unpackaged semiconductor device; and testing the unpackaged semiconductor device with the controller and via the probe.

11. A tested semiconductor device comprising:

an unpackaged semiconductor device comprising a plurality of contact pads, wherein the unpackaged semiconductor device has been tested through a testing process of performing the method as claimed in claim 1 to obtain a result, and then making the contact pads mechanically and electrically contacted according to the result.

12. A method of generating a virtual mark image which represents a portion of a probe system, the probe system comprising a probe and a substrate, the substrate comprising one or more devices under test, the probe being configured to test the device under test, the method comprising the steps of:

obtaining, with an optical image-forming device, a present probe system image of at least a part of the probe system, the present probe system image comprising one or both of:

an image of at least a part of the probe; and an image of at least a part of the substrate;

generating the virtual mark image with a controller based on at least a part of the present probe system image; and presenting the virtual mark image with a display;

wherein the virtual mark image comprises one of:

a representation of a probe contact position, the probe contact position being a position, at which a probe tip of the probe is predetermined to start contacting a contact pad of the device under test; and a representation of a probe target position, the probe target position being a position, at which the probe tip of the probe is predetermined to be stopped after skating on the contact pad.

13. The method as claimed in claim 12, wherein the controller obtains, based on one of a skate distance value and an overdrive value and a skate distance to overdrive relation dataset, the other of the skate distance value and the overdrive value, and obtains, based on the skate distance value and the probe target position, the probe contact position.

14. The method as claimed in claim 12, wherein the controller obtains, based on one of a skate distance value and an overdrive value and a skate distance to overdrive relation dataset, the other of the skate distance value and the overdrive value, and obtains, based on the skate distance value and a present probe position, a relative target position; the present probe position is a present position of the probe tip of the probe; a relative distance between the relative target position and the present probe position equals to the skate distance value.

15. The method as claimed in claim 12, wherein in the present probe system image, the device under test is clearer than at least the probe tip of the probe; said generating the virtual mark image comprises generating a virtual alignment mark showing the probe contact position.

16. The method as claimed in claim 15, wherein said generating the virtual alignment mark comprises determining a relative position of the virtual alignment mark with respect to the probe tip of the probe; said generating the virtual mark image comprises altering, based on at least a part of the determined relative position of the virtual alignment mark with respect to the probe tip, the virtual mark image to make the virtual mark image comprise the virtual alignment mark.

17. The method as claimed in claim 12, wherein in the present probe system image, at least the probe tip of the probe is clearer than the device under test; said generating the virtual mark image comprises generating a virtual alignment mark showing a relative target position; a relation between the relative target position and a present position of the probe tip is identical to a relation between the probe target position and the probe contact position.

18. The method as claimed in claim 17, wherein said generating the virtual alignment mark comprises determining a relative position of the virtual alignment mark with respect to the probe tip of the probe; said generating the virtual mark image comprises altering, based on at least a part of the determined relative position of the virtual alignment mark with respect to the probe tip, the virtual mark image to make the virtual mark image comprise the virtual alignment mark.

* * * * *